United States Patent
Sugano

(10) Patent No.: US 7,459,965 B2
(45) Date of Patent: Dec. 2, 2008

(54) SEMICONDUCTOR INTEGRATED CIRCUIT

(75) Inventor: Takashi Sugano, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 105 days.

(21) Appl. No.: 11/098,620

(22) Filed: Apr. 5, 2005

(65) Prior Publication Data

US 2005/0224911 A1    Oct. 13, 2005

(30) Foreign Application Priority Data

Apr. 7, 2004    (JP)    ............................. 2004-113312

(51) Int. Cl.
*H01L 25/00*    (2006.01)
(52) U.S. Cl. .................... 327/564; 327/565; 327/566
(58) Field of Classification Search .................. None
See application file for complete search history.

(56) References Cited

U.S. PATENT DOCUMENTS 5,869,852 A * 2/1999 Kinoshita ................... 257/207
6,657,318 B2 * 12/2003 Ishikawa et al. ............. 307/30

FOREIGN PATENT DOCUMENTS

| CN | 1428856 | | 7/2003 |
|---|---|---|---|
| JP | 406038368 | * | 2/1994 |
| JP | 06-334494 | | 12/1994 |
| JP | 08102525 | * | 4/1996 |
| JP | 10-135336 | * | 5/1998 |
| JP | 2001-148471 | | 5/2001 |
| JP | 2004-006691 | | 1/2004 |

* cited by examiner

*Primary Examiner*—Tuan T Lam
(74) *Attorney, Agent, or Firm*—Morrison & Foerster LLP

(57) ABSTRACT

The invention provides a semiconductor integrated circuit of which malfunction caused by noise from outside is reduced. The semiconductor integrated circuit has a power supply terminal, a ground terminal, internal circuits supplied with a power supply potential and a ground potential from the power supply terminal and the ground terminal, output circuits, an exclusive ground wiring extending from the ground terminal, a first capacitor connected between the exclusive ground wiring and a power supply wiring, an exclusive power supply wiring extending from the power supply terminal, and a second capacitor connected between the exclusive power supply wiring and a ground wiring.

16 Claims, 6 Drawing Sheets

SEMICONDUCTOR INTEGRATED CIRCUIT

CROSS-REFERENCE OF THE INVENTION

This invention is based on Japanese Patent Application No. 2004-113312, the content of which is incorporated by reference in its entirety.

BACKGROUND OF THE INVENTION

1. Field of the Invention

This invention relates to a semiconductor integrated circuit, particularly to a semiconductor integrated circuit having an internal circuit supplied with a power supply potential and a ground potential and an input circuit or an output circuit.

2. Description of the Related Art

Conventionally, a microcomputer chip has been known as a semiconductor integrated circuit formed of a plurality of internal circuits on a same semiconductor substrate, for example. The microcomputer chip as a semiconductor integrated circuit has a memory circuit such as an arithmetic circuit or a flash memory as an internal circuit, for example.

FIG. 5 is an equivalent circuit diagram showing a semiconductor integrated circuit that formed a basis of this invention. FIG. 6 is a circuit diagram showing a flash memory that is an example of the internal circuit of the semiconductor integrated circuit of FIG. 5.

As shown in FIG. 5, a plurality of internal circuits 1A, 1B, . . . are formed on a semiconductor substrate 200 of the semiconductor integrated circuit. At least one of these internal circuits, for example, the internal circuit 1A is the flash memory as the memory circuit, and the other one of the internal circuits, for example, the internal circuit 1B, is a central processing unit as an arithmetic circuit. These internal circuits 1A and 1B are supplied with a power supply potential Vdd and a ground potential Vss from a power supply terminal Pdd and a ground terminal Pss formed as pad electrodes through a power supply wiring 11 and a ground wiring 21, for example.

Furthermore, an output circuit 31 formed of a P-channel type output transistor MP1 and an N-channel type output transistor MN1 as switching elements is formed on the semiconductor substrate 200. An output terminal P1 formed as a pad electrode for example is connected between the output transistor MP1 and the output transistor MN1. The output circuit 31 outputs an output signal received from the internal circuit or other external circuit from its output terminal P1 as a binary discrete signal.

In a similar manner, an output circuit 32 formed of a P-channel type output transistor MP2 and an N-channel type output transistor MN2 as switching elements is formed on the semiconductor substrate 200. An output terminal P2 formed as a pad electrode for example is connected between the output transistor MP2 and the output transistor MN2. These output circuits 31 and 32 are commonly supplied with a power supply potential Vdd and a ground potential Vss from the power supply terminal Pdd and the ground terminal Pss through a power supply wiring 10 and a ground wiring 20.

However, when noise from outside of the semiconductor integrated circuit is transmitted through the output terminals P1 and P2, the noise is transmitted to the power supply wirings 10 and 11 or the ground wirings 20 and 21 through the output transistors MP1, MN1, MP2, and MN2. With this noise, the power supply potential Vdd or the ground potential Vss fluctuate. The fluctuation of the power supply potential Vdd or the ground potential Vss inverts data in the internal circuits 1A and 1B supplied with the power supply potential Vdd and the ground potential Vss, causing malfunction of the semiconductor integrated circuit.

Hereafter, description will be made on a mechanism of the malfunction when the internal circuit 1A is a flash memory, with reference to a circuit diagram of FIG. 6 showing a structure of a flash memory of the conventional art. FIG. 6 shows main components of the flash memory.

The structure of the flash memory will be described first. As shown in FIG. 6, the internal circuit 1A or the flash memory has a memory cell MC, a reference cell RC, and a readout circuit COMP formed of a comparator supplied with a power supply potential Vdd and a ground potential Vss.

The memory cell MC is formed of a memory transistor MT having a floating gate. The memory transistor MT is stored with "0" or "1" as a storage state corresponding to a charge accumulation state of the floating gate. This storage state is binary data or program data used in an arithmetic circuit and so on. The memory transistor MT is connected with an input terminal of the readout circuit COMP through an output line 61. When this memory transistor MT turns on, in response to its storage state, the potential of the output line 61 is set at a predetermined high level potential or low level potential.

The reference RC is formed of a reference transistor RT having a floating gate, similarly. The reference transistor RT is connected with the power supply potential Vdd and the ground potential Vss and connected with a reference terminal of the readout circuit COMP through a reference line 62.

The readout circuit COMP compares the potentials of the output line 61 and the reference line 62. When the potential of the output line 61 does not exceed the potential of the reference line 62, the readout circuit COMP determines that the storage state of this memory cell is "0", and outputs a predetermined potential indicating the storage state "0" under the application of the power supply potential Vdd and the ground potential Vss. When the potential of the output line 61 exceeds the potential of the reference line 62, to the contrary, the readout circuit COMP determines that the storage state of this memory cell is "1" and outputs a predetermined potential indicating the storage state "1" under the application of the power supply potential Vdd and the ground potential Vss. These two predetermined potentials are outputted from the output terminal P1 through the output transistors MP1 and MN1 of the output circuit 31 shown in FIG. 5, for example.

At this time, when noise from outside of the semiconductor integrated circuit is transmitted to the inside of the semiconductor integrated circuit through the output terminals P1 and P2 of the output circuits 31 and 32 of FIG. 5, the noise is transmitted to the power supply wirings 10 and 11 or the ground wirings 20 and 21 through the output transistors MP1, MN1, MP2, and MN2 of the output circuits 31 and 32. With this noise, the power supply potential Vdd or the ground potential Vss fluctuates.

In this case, in at least one of the memory cell MC, the reference memory RC, and the readout circuit COMP of the flash memory in FIG. 6 supplied with the power supply voltage Vdd or the ground potential Vss, the storage state is inverted under the influence of the fluctuation of the power supply potential Vdd or the ground potential Vss supplied thereto. This causes an output of a false storage state (i.e. bit inversion), an error in data to be read, and malfunction of the semiconductor integrated circuit (e.g. execution of a different program).

Therefore, as shown in FIG. 5, a noise countermeasure of preventing the influence of the fluctuations of the power supply potential Vdd and the ground potential Vss on the internal circuits 1A and 1B has been provided by connecting the capacitors CA and CB between the power supply wiring 11 and the ground wiring 21 of the internal circuits 1A and 1B.

The relevant technology is described in Japanese Patent Application Publication Nos. 2001-148471, 2004-6691, and Hei. 6-334494.

However, this noise countermeasure in the semiconductor integrated circuit is limited to the internal circuits 1A and 1B. Therefore, even though the noise countermeasure is provided for the internal circuits 1A and 1B, the influence of the fluctuation of the power supply potential Vdd or the ground potential Vss caused by the noise has not been removed properly. As a result, the malfunction of the semiconductor integrated circuit occurs in spite of the noise countermeasure.

SUMMARY OF THE INVENTION

The invention provides a semiconductor integrated circuit that includes a power supply terminal, a ground terminal, an internal circuit supplied with a power supply potential from the power supply terminal and a ground potential from the ground terminal, a switching element supplied with the power supply potential from the power supply terminal through a power supply wiring and connected with an input terminal or an output terminal, an additional ground wiring extending from the ground terminal, and a capacitor connected with the additional ground wiring and the power supply wiring.

The invention also provides a semiconductor integrated circuit that includes a power supply terminal, a ground terminal, an internal circuit supplied with a power supply potential from the power supply terminal and a ground potential from the ground terminal, a switching element supplied with the ground potential from the ground terminal through a ground wiring and connected with an input terminal or an output terminal, an additional power supply wiring extending from the power supply terminal, and a capacitor connected with the additional power supply wiring and the ground wiring.

The invention further provides a semiconductor integrated circuit that includes a power supply terminal, a ground terminal, an internal circuit supplied with a power supply potential from the power supply terminal and a ground potential from the ground terminal, a first switching element supplied with the power supply potential from the power supply terminal through a power supply wiring and connected with an input terminal or an output terminal, an additional ground wiring extending from the ground terminal, a first capacitor connected with the additional ground wiring and the power supply wiring, a second switching element supplied with the ground potential from the ground terminal through a ground wiring and connected with the input terminal or the output terminal with which the first switching element is connected, an additional power supply wiring extending from the power supply terminal, and a second capacitor connected with the additional power supply wiring and the ground wiring.

BRIEF DESCRIPTION OF THE DRAWINGS

FIG. 6 is an equivalent circuit diagram of a conventional flash memory of.

DETAILED DESCRIPTION OF THE INVENTION

Embodiments of the invention will be described with reference to drawings. The semiconductor integrated circuit is a microcomputer chip in these embodiments, but can be of other form.

Figure 1:
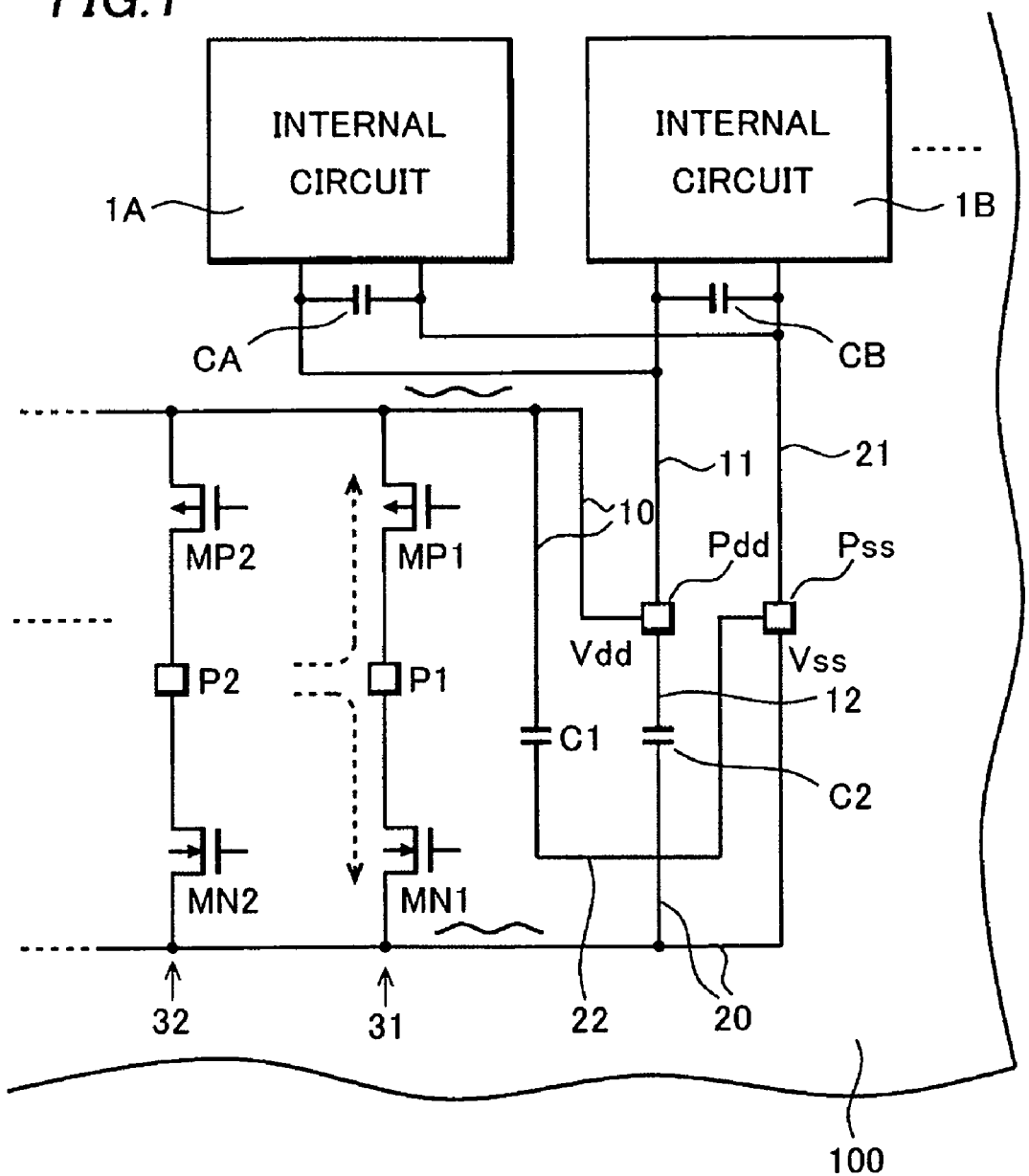
FIG. 1 is an equivalent circuit diagram of a semiconductor integrated circuit of a first embodiment of the invention.
Figure 5:
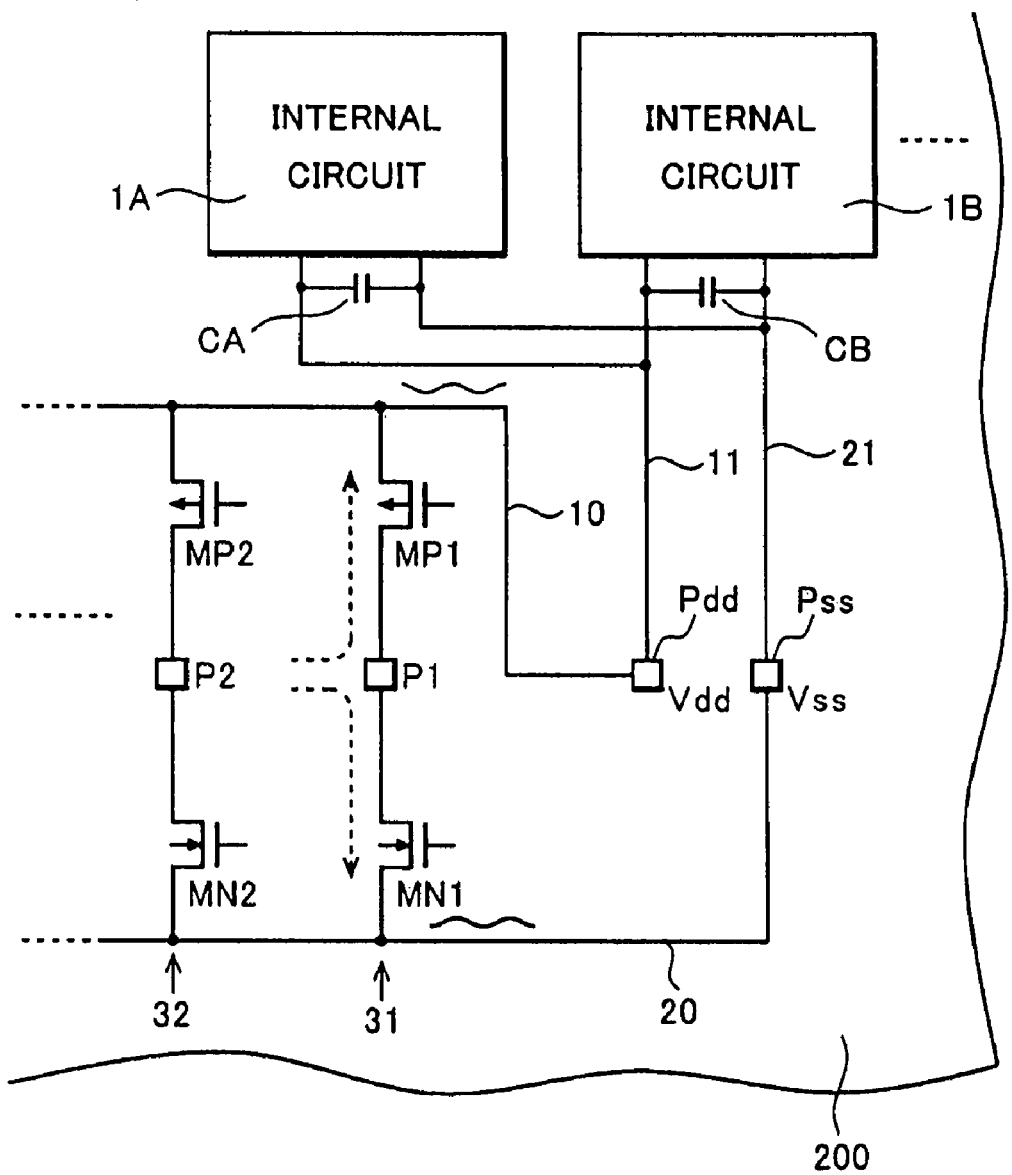
FIG. 5 is an equivalent circuit diagram of a semiconductor integrated circuit that formed a basis of this invention.

A semiconductor integrated circuit of a first embodiment of the invention will be described first. FIG. 1 is an equivalent circuit diagram of the semiconductor integrated circuit of the first embodiment. In FIG. 1, the same numerals as in the conventional circuit shown in FIG. 5 are given to the corresponding components.

Figure 6:
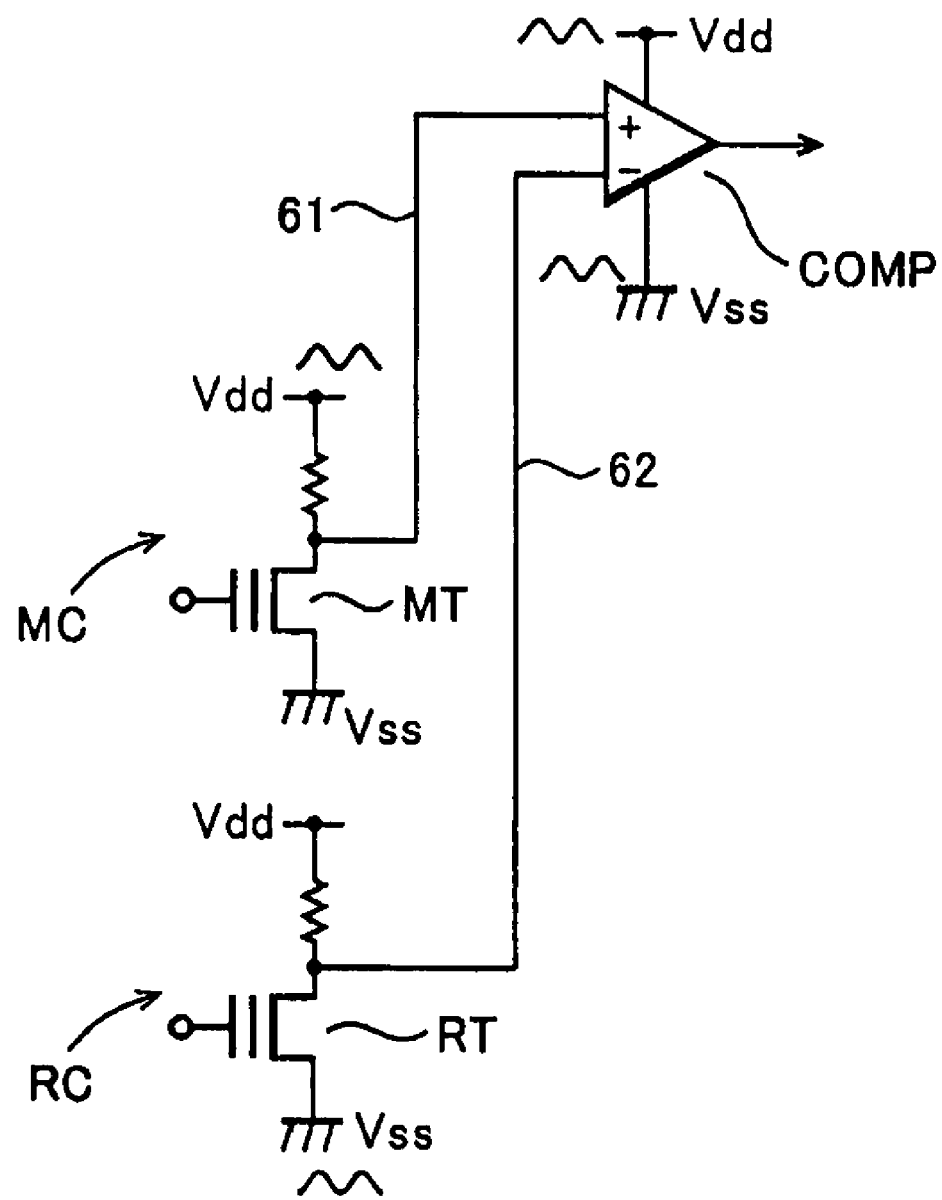

As shown in FIG. 1, a plurality of internal circuits 1A and 1B is formed on a semiconductor substrate 100 of the semiconductor integrated circuit of this embodiment. At least one of these internal circuits, for example, the internal circuit 1A, is formed as a flash memory as a memory circuit. This internal circuit 1A or the flash memory has the same structure as the structure of the flash memory shown in FIG. 6, for example. Alternatively, the internal circuit 1A can be the other memory circuit having a structure other than the structure of the flash memory shown in FIG. 6. For example, the internal circuit B may be a central processing unit as an arithmetic circuit, or an arithmetic circuit.

These internal circuits 1A and 1B are supplied with a power supply potential Vdd and a ground potential Vss from a power supply terminal Pdd and a ground terminal Pss formed as pad electrodes, for example, through a power supply wiring 11 and a ground wiring 21. FIG. 1 shows the two internal circuits 1A and 1B, but the number of the internal circuits is not limited to this. For example, one internal circuit or three or more internal circuits can be formed there. In this case, at least one internal circuit only need be a memory circuit such as a flash memory.

An output circuit 31 includes a P-channel type output transistor MP1 and a N-channel type output transistor MN1 serving as switching elements formed on the semiconductor substrate 100. An output terminal P1 formed as a pad electrode for example is connected between the output transistor MP1 and the output transistor MN1. The output circuit 31 outputs an output signal received from the internal circuit or the other external circuit from its output terminal P1 to the outside of the semiconductor integrated circuit as a binary discrete signal.

Similarly, an output circuit 32 includes a P-channel type output transistor MP2 and a N-channel type output transistor MN2 serving as switching elements formed on the semiconductor substrate 100. An output terminal P2 formed as a pad electrode for example is connected between the output transistor MP2 and the output transistor MN2.

These output circuits 31 and 32 are commonly supplied with the power supply potential Vdd and the ground potential Vss from the power supply terminal Pdd and the ground terminal Pss through the power supply wiring 10 and the ground wiring 20. That is, the output transistors MP1 and MP2 are connected with the power supply wiring 10 extending from the power supply terminal Pdd, and the output transistors MN1 and MN2 are connected with the ground wiring 20 extending from the ground terminal Pss. Although FIG. 1 shows the two output circuits 31 and 32, one output circuit or three or more output circuits may be provided.

Furthermore, in the semiconductor integrated circuit formed with the output circuits 31 and 32, a capacitor CA is connected between the power supply wiring 11 and the ground wiring 21 on the internal circuit 1A side, and a capacitor CB is connected between the power supply wiring 11 and the ground wiring 21 on the internal circuit 1B side, as shown in FIG. 1. The capacitors CA and CB reduce the influence of fluctuations of the power supply potential and the ground potential on the internal circuits 1A and 1B, as a noise countermeasure applied to the internal circuits 1A and 1B, in a manner similar to the semiconductor integrated circuit shown in FIG. 5. It is noted that the connection of these capacitors CA and CB shown in FIG. 5 can be omitted in this embodiment.

In addition to the above structure, an exclusive ground wiring 22 is formed extending from the ground terminal Pss in this embodiment, and a first capacitor C1 is connected between the exclusive ground wiring 22 and the power supply wiring 10. Furthermore, an exclusive power supply line 12 is formed extending from the power supply terminal Pdd, and a second capacitor C2 is connected between the exclusive power supply wiring 12 and the ground wiring 20. Capacitance of each of the first and second capacitors C1 and C2 is preferably 100 pF to 200 pF, for example.

It is preferable that the first and second capacitors C1 and C2 are gate capacitors. Alternatively, the first and second capacitors C1 and C2 can be the capacitors other than the gate capacitors. For example, the first and second capacitors C1 and C2 can be diffusion capacitors or capacitors each formed of two semiconductor electrodes made of, for example, polysilicon and a capacitor insulation film.

Figure 2A:
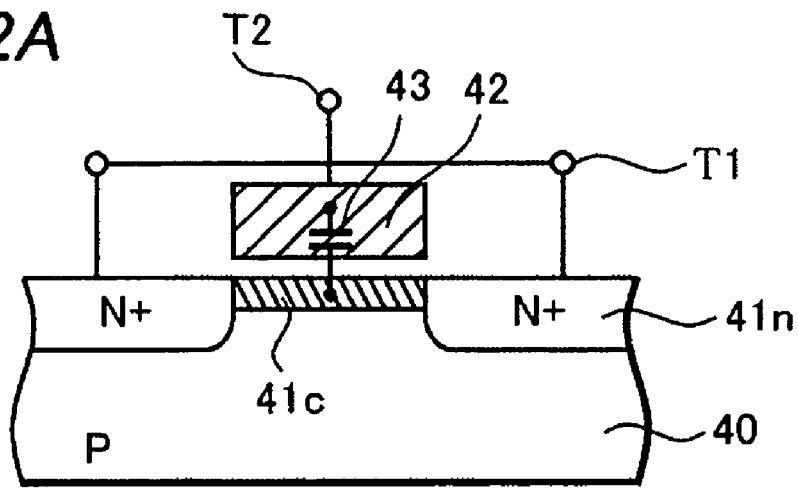
FIGS. 2A, 2B, and 2C are schematic cross-sectional views showing structures of a capacitor of the circuit of FIG. 1.
Figure 2B:
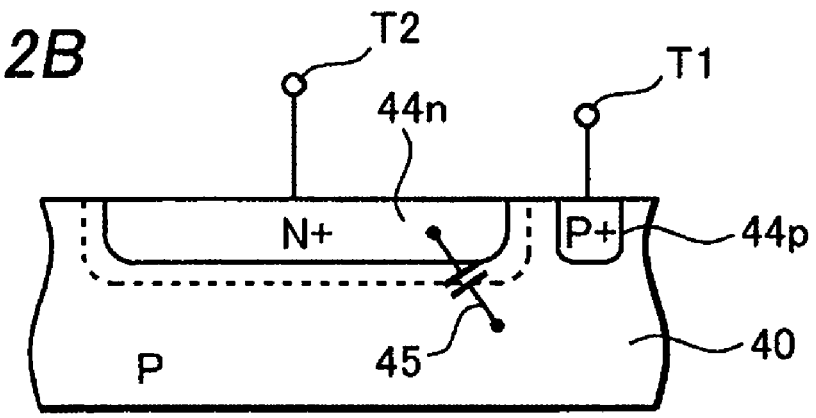
Figure 2C:
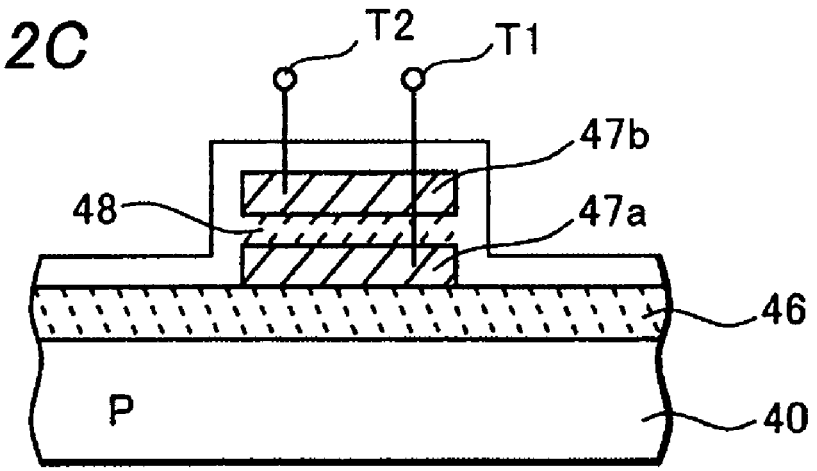

FIGS. 2A, 2B, and 2C show schematic cross-sectional views showing a structure of the first and second capacitors C1 and C2. In each of the first and second capacitors C1 and C2 formed as gate capacitors, an N+ diffusion layer 41n is formed on a P-type semiconductor substrate 40 on both sides of a channel region 41c doped with an N-type impurity, as shown in FIG. 2A. A terminal T1 extends from the N+ diffusion layer 41n. A gate electrode 42 is formed on the channel region 41c with an insulation film therebetween. A terminal T2 extends from the gate electrode 42. The terminals T1 and T2 are connected with the exclusive ground wiring 22 and the power supply wiring 10 or the exclusive power supply wiring 12 and the ground wiring 20. When the potential is applied to the terminals T1 and T2, capacitance 43 is generated between the channel region 41c and the gate electrode 42.

In each of the first and second capacitors C1 and C2 formed as diffusion capacitors, a P+ diffusion layer 44p and an N+ diffusion layer 44n are formed on the P-type semiconductor substrate 40, being spaced from each other, for example, as shown in FIG. 2B. A terminal T1 extends from the P+ diffusion layer 44p, and a terminal T2 extends from the N+ diffusion layer 44n. The terminals T1 and T2 are connected with the exclusive ground wiring 22 and the power supply wiring 10, or the exclusive power supply wiring 12 and the ground wiring 20. When the potential is applied to the terminals T1 and T2, capacitance 45 is generated between the P-type semiconductor substrate 40 and the N+ diffusion layer 44n.

In each of the first and second capacitors C1 and C2 formed as capacitors having two semiconductor electrodes of polysilicon and a capacitor insulation film, a first semiconductor electrode 47a formed of, for example, polysilicon is formed on the P-type semiconductor substrate 40 formed with an insulation film 46, for example, as shown in FIG. 2C. On the first semiconductor electrode 47a, a second semiconductor electrode 47b is formed with a capacitor insulation film 48 therebetween. Terminals T1 and T2 extend from the first and second semiconductor electrodes 47a and 47b, respectively. The terminals T1 and T2 are connected with the exclusive ground wiring 22 and the power supply wiring 10 or the exclusive power supply wiring 12 and the ground wiring 20. When the potential is applied to the terminals Ti and T2, capacitance is generated between the first and second semiconductor electrodes 47a and 47b.

It is noted that the structure of the first and second capacitors C1 and C2 may have a structure other than the above structure as long as the elements can be formed on the semiconductor substrate and function as capacitors.

As described above, a capacitor is connected between the exclusive ground wring 22 extending from the ground terminal Pss and the power supply wiring 10 or between the exclusive power supply wiring 12 extending from the power supply terminal Pdd and the ground wiring 20. When noise is applied to the output circuits 31 and 32 from outside, the fluctuations of the power supply potential Vdd and the ground potential Vss caused by the noise are removed by the first and second capacitors C1 and C2 between the power supply terminal Pdd and the ground terminal Pss and the output circuits 31 and 32. That is, the fluctuations of the power supply potential Vdd and the ground potential Vss caused by the noise are removed at the power supply wiring 11 and the ground wiring 21 connected with the internal circuits 1A and 1B, or reduced there compared with the semiconductor integrated circuit shown in FIG. 5.

In this manner, the fluctuations of the power supply potential Vdd and the ground potential Vss caused by the noise are prevented from being transmitted to the internal circuits 1A and 11B, so that malfunction is minimized. When the internal circuit 1A is a flash memory, the inversion of the storage state (i.e. bit inversion) is prevented. This can minimize the malfunction (e.g. execution of a different program) of the semiconductor integrated circuit caused by an error occurring in data to be read.

Figure 3:
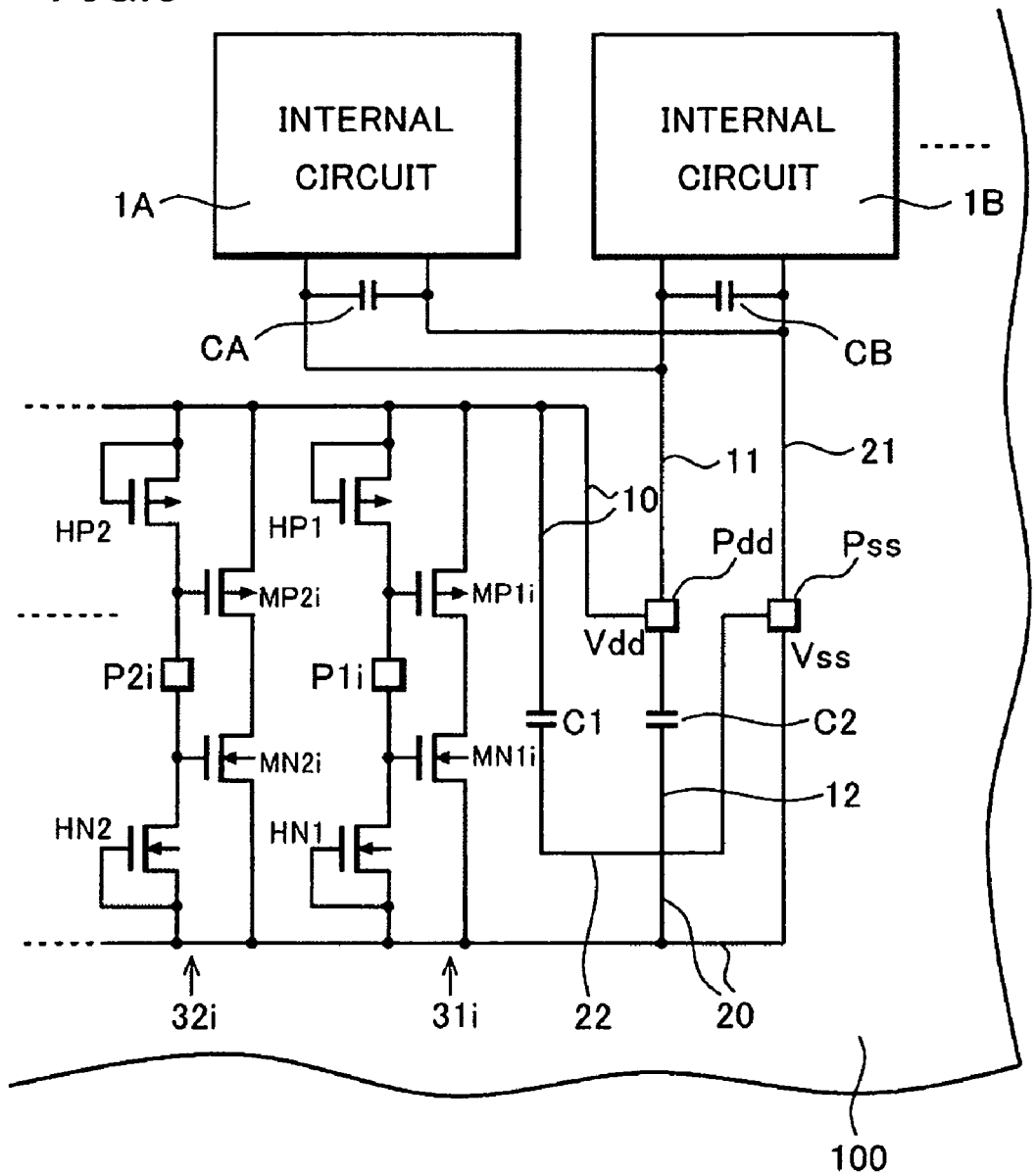
FIG. 3 is an equivalent circuit diagram of a semiconductor integrated circuit of a second embodiment of the invention.

Next, a semiconductor integrated circuit of a second embodiment will be described. FIG. 3 is an equivalent circuit diagram of the semiconductor integrated circuit of the second embodiment. In FIG. 3, the same numerals as in the first embodiment are given to the corresponding components.

In the semiconductor integrated circuit of this embodiment, input circuits 31i and 32i inputting a signal received from an external circuit to the semiconductor integrated circuit, instead of forming the output circuits 31 and 32, as shown in FIG. 3. The other structure of this embodiment is the same as the structure of the semiconductor integrated circuit of the first embodiment shown in FIG. 1.

The input circuit 31i includes a P-channel type input transistor MP1i and a N-channel type input transistor MN1i, and the input circuit 32i includes a P-channel type input transistor MP2i and a N-channel type input transistor MN2i. These input transistors are connected with P-channel type protection transistors HP1 and HP2 and N-channel type protection transistors HN1 and HN2 for preventing a large current flow. Input terminals P1i and P2i are provided between the protection transistors HP1 and HN1 and between the protection transistors HP2 and HN2, respectively, as pad electrodes.

These input circuits 31i and 32i are commonly supplied with the power supply potential Vdd and the ground potential Vss from the power supply terminal Pdd and the ground terminal Pss through the power supply wiring 10 and the ground wiring 20. That is, the input transistors MP1i and MP2i are connected with the power supply wiring 10 extending from the power supply terminal Pdd. The input transistors MN1i and MN2i are connected with the ground wiring 20 extending from the ground terminal Pss. It is noted that FIGS. 2A, 2B, and 2C show the two input circuit 31i and 32i, but one input circuit or three or more input circuits may be provided.

In a similar manner to the first embodiment, first and second capacitors C1 and C2 are connected between an exclusive ground wiring 22 extending from the ground terminal Pss and the power supply wiring 10 and between an exclusive power supply wiring 12 extending from the power supply terminal Pdd and the ground wiring 20, respectively, in the semiconductor integrated circuit of this embodiment. Under this structure, when noise is applied from outside to the input circuits 31i and 32i, the fluctuations of the power supply potential Vdd and the ground potential Vss caused by the noise is removed by the first and second capacitors C1 and C2 between the power supply terminal Pdd and the ground terminal Pss and the input circuits 31i and 32i. That is, the fluctuations of the power supply potential Vdd and the ground potential Vss caused by the noise are removed at the power supply wiring 11 and the ground wiring 21 connected with the internal circuits 1A and 1B, or reduced there compared with the semiconductor integrated circuit shown in FIG. 5.

In this manner, the fluctuations of the power supply potential Vdd and the ground potential Vss caused by the noise are prevented from being transmitted to the internal circuits 1A and 1B, so that malfunction is minimized. When the internal circuit 1A is a flash memory, the bit inversion is prevented. This can minimize the malfunction (e.g. execution of a different program) of the semiconductor integrated circuit caused by an error occurring in data to be read.

Figure 4:
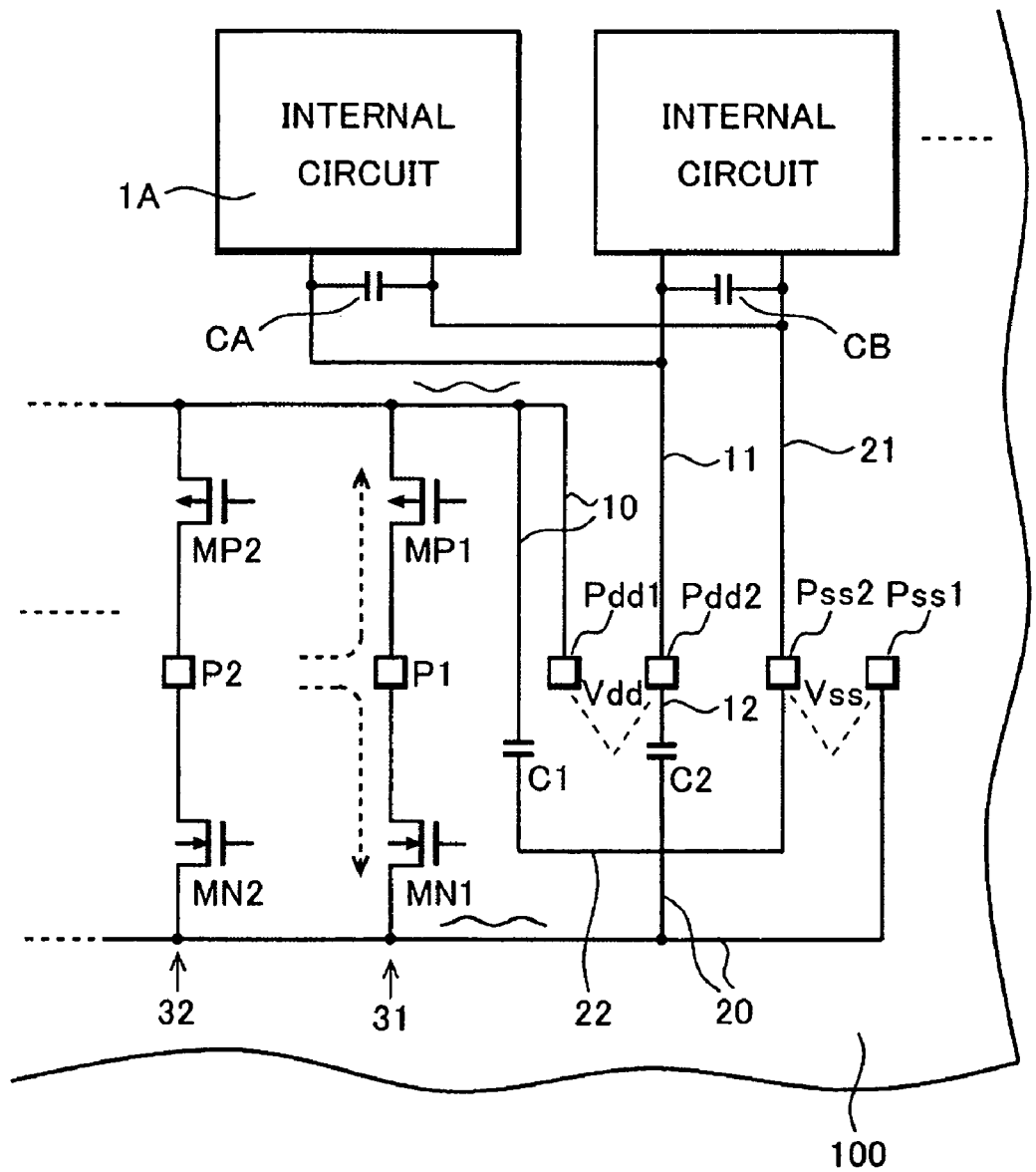
FIG. 4 is an equivalent circuit diagram of a semiconductor integrated circuit of a third embodiment of the invention.

Next, a semiconductor integrated circuit of a third embodiment will be described. FIG. 4 is an equivalent circuit diagram of the semiconductor integrated circuit of the third embodiment. In the semiconductor integrated circuit of the invention, two power supply terminals Pdd1 and Pdd2 and two ground terminals Pss1 and Pss2 are provided as shown in FIG. 4. The other structure of this embodiment is the same as the structure of the semiconductor integrated circuit of the first embodiment shown in FIG. 1. In FIG. 4, the same numerals as in the first embodiment are given to the corresponding components.

It is noted that the input circuits 31i and 32i of the semiconductor integrated circuit of the second embodiment shown in FIG. 3 may be formed in the semiconductor integrated circuit of this embodiment, instead of the output circuits 31 and 32.

In this embodiment, the power supply wiring 10 connected with the output circuits 31 and 32 extends from the first power supply terminal Pdd1. A power supply wiring 11 connected with the internal circuit 1A and 1B and an exclusive power supply line 12 connected with a second capacitor C2 extends from a second power supply terminal Pdd2. The first power supply terminal Pdd1 and the second power supply terminal Pdd2 are connected through a lead (shown by a dotted line) of a lead frame (not shown).

In a similar manner, a ground wiring 20 connected with the output circuits 31 and 32 extends from the first ground terminal Pss1. A ground wiring 21 connected with the internal circuits 1A and 1B and an exclusive ground wiring 22 connected with a first capacitor C1 extend from the second ground terminal Pss2. The first ground terminal Pss1 and the second ground terminal Pss2 are connected through a lead (shown by a dotted line) of a lead frame (not shown).

In this manner, the first and second power supply terminals Pdd1 and Pdd2 and the first and second ground terminals Pss1 and Pss2, which are connected to each other through the lead, respectively, are thus provided, so that the semiconductor integrated circuit can deal with a large current flow. That is, even though supplied with the large current, the semiconductor integrated circuit can be driven stably.

In the above embodiments, the first capacitor C1 is connected between the exclusive ground wiring 22 extending from the ground terminal Pss (or the second ground terminal Pss2) and the power supply wiring 10, and the second capacitor C2 is connected between the exclusive power supply wiring 12 extending from the power supply terminal Pdd (or the second power supply terminal Pdd2) and the ground wiring 20. However, modification are possible. For example, the semiconductor integrated circuit of the invention can be formed so that the first capacitor C1 is connected between the exclusive ground wiring 22 extending from the ground terminal Pss (or the second ground terminal Pss2) and the power supply wiring 10, and the second capacitor C2 is not connected between the exclusive power supply wiring 12 extending from the power supply terminal Pdd (or the second power supply terminal Pdd2) and the ground wiring 20. In this case, the output transistors MN1 and MN2 or the input transistors MN1i and MN2i and the protection transistors HN1 and HN2 are omitted.

Alternatively, the semiconductor integrated circuit of the invention can be formed so that the first capacitor C1 is not connected between the exclusive ground wiring 22 extending from the ground terminal Pss (or the second ground terminal Pss2) and the power supply wiring 10, and the second capacitor C2 is connected between the exclusive power supply wiring 12 extending from the power supply terminal Pdd (or the second power supply terminal Pdd2) and the ground wiring 20. In this case, the output transistors MP1 and MP2 or the input transistors MP1i and MP2i and the protection transistors HP1 and HP2 are omitted.

In the first, second, third embodiments, the power supply potential Vdd is set at any values as long as it is relatively high compared with the ground potential Vss. That is, the ground potential Vss is not limited to 0V, and can be a negative potential.

What is claimed is:

1. A semiconductor integrated circuit comprising:
   a power supply terminal;
   a ground terminal;
   an internal circuit supplied with a power supply potential from the power supply terminal and a ground potential from the ground terminal;
   a switching element supplied with the power supply potential from the power supply terminal through a power supply wiring;
   an input terminal or an output terminal connected to the switching element;
   a ground wiring extending from the ground terminal;
   an additional ground wiring extending from the ground terminal; and
   a capacitor connected to the ground terminal through the additional ground wiring and connected to the switching element through the power supply wiring,
   wherein the power supply terminal is connected between the switching element and the internal circuit.

2. The semiconductor integrated circuit of claim 1, wherein the capacitor comprises a gate capacitor.

3. The semiconductor integrated circuit of claim 1, wherein the capacitor comprises a diffusion capacitor.

4. The semiconductor integrated circuit of claim 1, wherein the capacitor comprises a first semiconductor electrode formed on a semiconductor substrate, a capacitor insulation film formed on the first semiconductor electrode and a second semiconductor electrode formed on the capacitor insulation film.

5. The semiconductor integrated circuit of claim 1, wherein the internal circuit comprises a flash memory.

6. A semiconductor integrated circuit comprising:
   a power supply terminal;
   a ground terminal;
   an internal circuit supplied with a power supply potential from the power supply terminal and a ground potential from the ground terminal;
   a switching element supplied with the ground potential from the ground terminal through a ground wiring;
   an input terminal or an output terminal connected to the switching element;
   a power supply wiring extending from the power supply terminal;
   an additional power supply wiring extending from the power supply terminal; and
   a capacitor connected to the power supply terminal through the additional power supply wiring and connected to the switching element through the ground wiring,
   wherein the ground terminal is connected between the switching element and the internal circuit.

7. The semiconductor integrated circuit of claim 6, wherein the capacitor comprises a gate capacitor.

8. The semiconductor integrated circuit of claim 6, wherein the capacitor comprises a diffusion capacitor.

9. The semiconductor integrated circuit of claim 6, wherein the capacitor comprises a first semiconductor electrode formed on a semiconductor substrate, a capacitor insulation film formed on the first semiconductor electrode and a second semiconductor electrode formed on the capacitor insulation film.

10. The semiconductor integrated circuit of claim 6, wherein the internal circuit comprises a flash memory.

11. A semiconductor integrated circuit comprising:
a power supply terminal;
a ground terminal;
an internal circuit supplied with a power supply potential from the power supply terminal and a ground potential from the ground terminal;
a first switching element supplied with the power supply potential from the power supply terminal through a power supply wiring;
an additional ground wiring extending from the ground terminal;
a first capacitor connected to the additional ground wiring and the power supply wiring;
a second switching element supplied with the ground potential from the ground terminal through a ground wiring;
an additional power supply wiring extending from the power supply terminal;
a second capacitor connected to the additional power supply wiring and the ground wiring; and
an input terminal or an output terminal connected to the first and second switching elements,
wherein the power supply terminal is connected between the first switching element and the internal circuit, and the ground terminal is connected between the second switching element and the internal circuit.

12. The semiconductor integrated circuit of claim 11, wherein each of the first and second capacitors comprises a gate capacitor.

13. The semiconductor integrated circuit of claim 11, wherein each of the first and second capacitors comprises a diffusion capacitor.

14. The semiconductor integrated circuit of claim 11, wherein each of the first and second capacitors comprises a first semiconductor electrode formed on a semiconductor substrate, a capacitor insulation film formed on the first semiconductor electrode and a second semiconductor electrode formed on the capacitor insulation film.

15. The semiconductor integrated circuit of claim 11, wherein the internal circuit comprises a flash memory.

16. The semiconductor device of claim 1, wherein the semiconductor integrated circuit is configured so that a signal generated by the internal circuit is outputted from the output terminal through the switching element.

* * * * *